US006841875B2

United States Patent
Ohsumi

(10) Patent No.: US 6,841,875 B2
(45) Date of Patent: Jan. 11, 2005

(54) SEMICONDUCTOR DEVICE

(75) Inventor: Takashi Ohsumi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/714,962

(22) Filed: Nov. 18, 2003

(65) Prior Publication Data
US 2004/0099950 A1 May 27, 2004

(30) Foreign Application Priority Data
Nov. 18, 2002 (JP) .......................... 2002-333404

(51) Int. Cl.[7] .............................................. H01L 23/48
(52) U.S. Cl. ..................... 257/738; 774/758; 774/737; 774/780; 774/781
(58) Field of Search .............................. 257/738, 737, 257/758, 780, 781

(56) References Cited

U.S. PATENT DOCUMENTS

| 5,554,887 | A | * | 9/1996 | Sawai et al. | 257/737 |
| 5,726,489 | A | * | 3/1998 | Matsuda et al. | 257/659 |
| 6,181,569 | B1 | * | 1/2001 | Chakravorty | 361/761 |
| 6,479,900 | B1 | * | 11/2002 | Shinogi et al. | 257/758 |
| 6,559,540 | B2 | * | 5/2003 | Kawashima | 257/737 |
| 6,621,154 | B1 | * | 9/2003 | Satoh et al. | 257/684 |
| 2003/0102551 | A1 | * | 6/2003 | Kikuchi | 257/701 |

FOREIGN PATENT DOCUMENTS

| JP | 2-306641 | * 12/1990 | ................ 257/701 |
| JP | 3065309 | 5/2000 | |
| JP | 2001-185444 | 7/2001 | |
| JP | 2001-521288 | 11/2001 | |
| JP | 2002-093945 | 3/2002 | |

* cited by examiner

Primary Examiner—Jasmine Clark
(74) Attorney, Agent, or Firm—Rabin & Berdo, P.C.

(57) ABSTRACT

A semiconductor device includes a semiconductor substrate formed with a plurality of electrode pads, and wiring electrically connecting the electrode pads to external electrodes to be connected to conductive patterns formed on an external circuit board, the wiring formed into a plurality of layers. The semiconductor device also includes insulating layers interposed between the layers of the wiring, and between the lowermost layer of the wiring and the semiconductor substrate, thereby to ensure insulation therebetween; the layers of the wiring each having depressed portions located at via holes formed in the insulating layers, the depressed portions connected to the lower layer of the wiring or the electrode pads; bump electrodes formed on the depressed portions of the uppermost layer of the wiring; external electrodes formed on the top surfaces of the bump electrodes; and a sealing layer formed over the uppermost layer of the wiring so as to expose the top surface of each of the bump electrodes.

20 Claims, 4 Drawing Sheets

SEMICONDUCTOR DEVICE

BACKGROUND OF THE INVENTION

1. Field of the Invention

The present invention relates to a semiconductor device and, in particular, relates to a chip size (scale) package (hereinafter referred to as "CSP") structure having a multiple layer wiring structure.

This application is counterpart of Japanese patent applications, Serial Number 333404/2002, filed Nov. 18, 2002, the subject matter of which is incorporated herein by reference.

2. Description of the Related Art

In a semiconductor device of this type, first wiring layer formed with wiring patterns is formed, via an insulating layer, on a semiconductor substrate formed with an integrated circuit, and second wiring layer formed with wiring patterns are further formed thereon via an insulating layer. I/O pads of the integrated circuit and the first wiring layer, and the first wiring layer and the second wiring layer are electrically connected to each other through via holes formed in the respective insulating layers, depending on requirement.

Bump electrodes (this electrode is also referred to as post electrode or columnar-shaped electrode or pillar-shaped electrode) are formed so as to erect from the uppermost layer wiring (the second layer wiring in this case), and external electrodes to be electrically connected to an external circuit board (this board is also referred to as mother board or wiring substrate) are formed at top surface of the bump electrodes, respectively. Further, a sealing resin layer is formed to cover the uppermost layer wiring and side surfaces of the bump electrodes (e.g. see Patent Literature 1).

[Patent Literature 1]

JP-A-2002-93945

In case of the semiconductor device having the CSP structure, the external electrodes formed on the top surface of the bump electrodes are electrically connected and fixed to the external circuit board through solder reflow or the like. That is, the semiconductor device is mounted on the external circuit board.

With this mounting arrangement, a thermal stress caused by a difference in thermal expansion coefficient between the semiconductor device and the external circuit board is absorbed by plastic deformation of the bump electrodes. As a result, breakage due to thermal fatigue in connecting portions between the external circuit board and the external electrodes, or physical influence of the thermal stress from wiring paths inside the CSP structure to the integrated circuit can be suppressed. Accordingly, as the height (the height means that distance between the top surface and the bottom surface) of the bump electrode increases, its plastic deformation is facilitated so that the suppression effect against the influence of the thermal stress is enhanced.

However, since each of the bump electrodes is erected from the uppermost layer wiring as described above, it is impossible to make the bump electrode longer without changing the thickness of the whole semiconductor device. Further, there has been a problem that for reducing the thickness of the whole semiconductor device or increasing the number of layers of the wiring of the CSP structure without changing the thickness thereof, the height of the bump electrode should be shortened contrariwise.

SUMMARY OF THE INVENTION

It is an object of the present invention to provide a semiconductor device that can ensure a necessary height of a bump electrode while ensuring a desired thickness of the whole semiconductor device and a desired number of layers of wiring.

It is another object of the present invention to provide a semiconductor device that can improve reliability against a thermal stress by utilizing a structure wherein bump electrodes having different heights can be formed.

According to one aspect of the present invention, for achieving one or more of the above objects, there is provided a semiconductor device which includes a semiconductor substrate formed with a plurality of electrode pads, and wiring electrically connecting the electrode pads to external electrodes to be connected to conductive patterns formed on an external circuit board, the wiring formed into a plurality of layers, the semiconductor device comprising insulating layers interposed between the layers of the wiring, and between the lowermost layer of the wiring and the semiconductor substrate, thereby to ensure insulation therebetween; the layers of the wiring each having depressed portions located at via holes formed in the insulating layers, the depressed portions connected to the lower layer of the wiring or the electrode pads; bump electrodes formed on the depressed portions of the uppermost layer of the wiring; external electrodes formed on the top surfaces of the bump electrodes; and a sealing layer formed over the uppermost layer of the wiring so as to expose the top surface of each of the bump electrodes.

According to another aspect of the present invention, there is provided the semiconductor device which includes the following features. Assuming that distances from a neutral point of a thermal stress of the semiconductor device to an arbitrary pair of the bump electrodes among the bump electrodes are set as $L_1$ and $L_2$, and heights of the pair of bump electrodes are set as $H_1$ and $H_2$, the heights of the pair of bump electrodes may be determined so as to satisfy:

when $L_1 < L_2$, then $H_1 \leq H_2$.

The above and further objects and novel features of the invention will more fully appear from the following detailed description, appended claims and the accompanying drawings.

BRIEF DESCRIPTION OF THE DRAWINGS

FIGS. 3A and 3B are diagrams showing a structure of a fourth embodiment according to a semiconductor device of the present invention, wherein FIG. 3A is a partial sectional view exemplarily showing an internal structure of a CSP structure, and FIG. 3B is a schematic plan view, as seeing the semiconductor device in a direction of arrow A in FIG. 3A.

DESCRIPTION OF THE PREFERRED EMBODIMENT

First Embodiment

Figure 1:
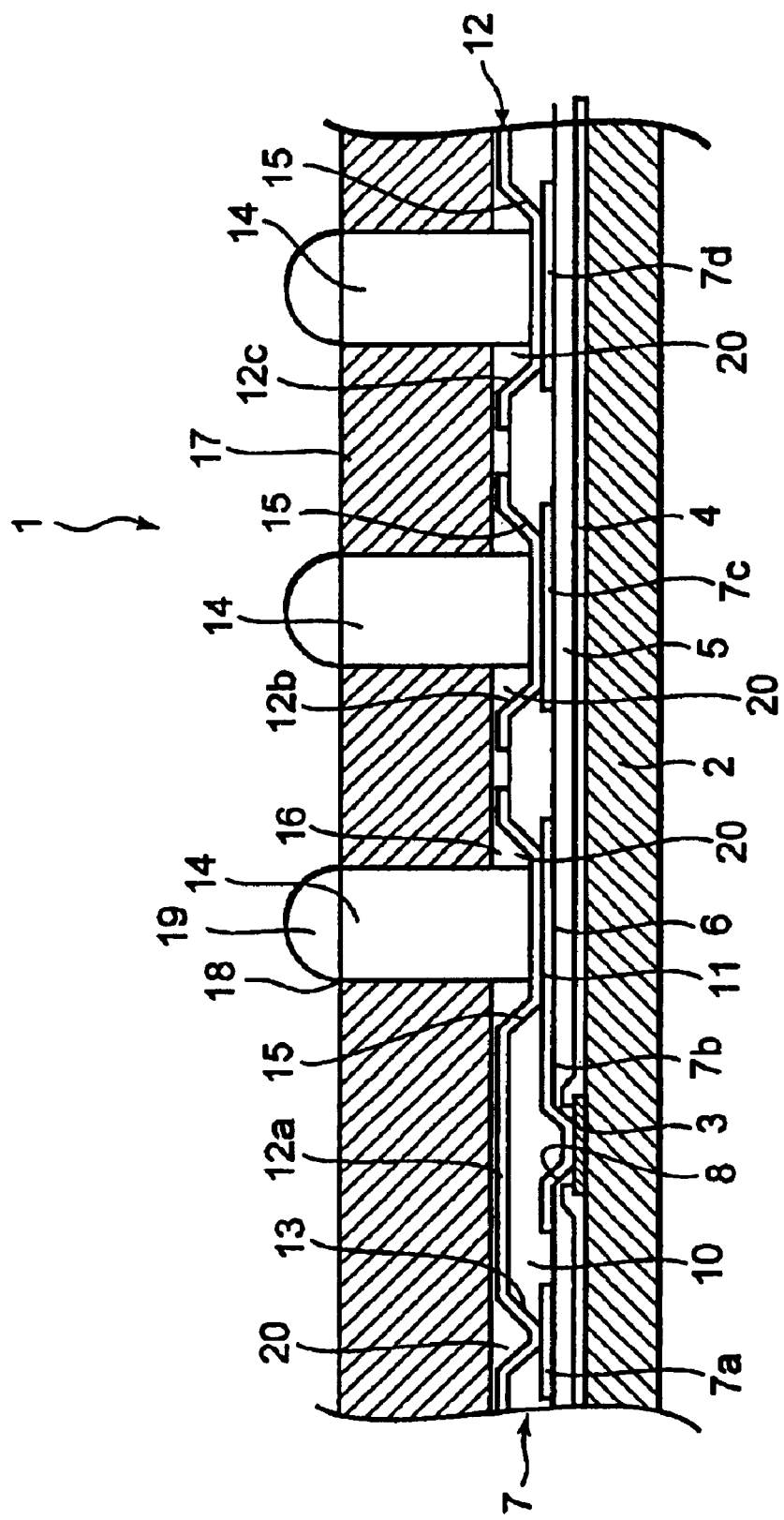
FIG. 1 is a partial sectional view showing an internal structure of a CSP structure of a first embodiment according to a semiconductor device-of the present invention.

FIG. 1 is a partial sectional view showing an internal structure of a CSP structure of a first embodiment according to a semiconductor device of the present invention.

A semiconductor substrate 2 of a semiconductor device 1 is formed with an integrated circuit (not shown). On the semiconductor substrate 2, a plurality of I/O pads 3 (only one is shown in FIG. 1) of the integrated circuit corresponding to electrode pads are formed. Further, on the semiconductor substrate 2, a surface protective film 4 for the integrated circuit is formed except surface portions of the I/O pads 3. Therefore, with these semiconductor substrate 2, I/O pads 3 and surface protective film 4, a simplified section of a normal semiconductor integrated circuit is shown.

A first insulating layer 5 is an insulating layer for a first wiring layer path formed thereon, and is formed to cover the surface protective film 4 except the surface portions of the I/O pads 3. A seed layer 6 is a layer that serves as an electrode for forming first wiring layer 7 on the first insulating layer 5 and the I/O pads 3 by plating, and is removed after the formation of the wiring, except those portions under wiring patterns.

The wiring patterns 7a, 7b, . . . are made of the first wiring layer material. These patterns are referred to as redistribution wirings. Particularly, the first wiring pattern is also called as first level wiring pattern. The first wiring layer is also called as first level wiring layer. Among wiring patterns 7a, 7b, . . . of the first wiring layer 7, the predetermined wiring pattern (e.g. the wiring pattern 7b) has depressed portions. The depressed portions are formed in positions of via holes 8 of the first insulating layer 5. The first wiring patterns are electrically connected to the I/O pads 3 of the integrated circuit through the via holes 8 at the depressed portions, respectively.

A second insulating layer 10 is an insulating layer for a second wiring layer path formed thereon, and is formed to cover the first wiring layer 7 except via holes 13 and 15 that expose later-described predetermined portions of the first wiring layer 7. These via holes are formed in a developing process by the photolithography, and peripheral portions thereof are formed tapered, respectively.

A seed layer 11 is a layer that serves as an electrode for forming second wiring layer 12 by plating on the second insulating layer 10 and the first wiring layer 7 exposed by the via holes, and is removed after the formation of the wiring, except those portions under wiring patterns.

The wiring patterns 12a, 12b, are made of the second wiring layer material. These patterns are referred to as redistribution wirings. Particularly, the second wiring pattern is also called as second level wiring pattern. The second wiring layer is also called a second level wiring layer. Among wiring patterns 12a, 12b, . . . of the second wiring layer 12, the predetermined wiring pattern has depressed portions 20. The depressed portions 20 are formed in positions of the via holes 13 and 15. The second wiring patterns are electrically connected individually to the predetermined wiring patterns of the first wiring layer 7.

Bump electrodes 14 are formed at predetermined portions on the respective wiring patterns 12a, 12b, . . . of the second wiring layer 12 being the uppermost wiring layer so as to electrically connect to the corresponding wiring patterns. The bump electrodes 14 are formed by, for example, plating using the seed layer 11 as an electrode. When forming the bump electrodes 14 in the depressed portions 20 of the second wiring layer 12, each of the bump electrodes is processed so that each bottom surface of the bump electrodes is formed on the corresponding depressed portion 20 directly contacting the first wiring layer 7. Therefore, the via hole 15 is formed to such an extent that the shape of a cross section of the bump electrode 14 is received within an area of the hole.

On the second wiring layer 12, an uppermost insulating layer 16 is formed so as to entirely cover the surfaces of the second wiring layer 12 and the second insulating layer 10, and further to level concave portions formed around the bump electrodes 14. Further, a sealing resin layer 17 having a thickness to such an extent that the top surface of each bump electrode 14 is exposed is formed on the uppermost insulating layer 16. An external electrode 19 is provided on a bump electrode surface treating layer 18 formed on the top surface of the bump electrode 14 that is exposed from the surface of the sealing resin layer 17.

By forming the wiring into multiple layers as described above, the degree of freedom for wiring design can be enhanced as compared with single wiring layer. FIG. 1 shows the structure wherein the second wiring pattern 12a is connected to the first wiring patterns 7a and 7b, and the first wiring pattern 7b is connected to the I/O pad 3. However, connecting portions therebetween are suitably provided according to wiring design.

A wiring structure including the first insulating layer 5, the first wiring layer 7, the second insulating layer 10, the second wiring layer 11, the bump electrodes 14, and the sealing resin layer 17 is explained as the CSP structure herein.

The semiconductor device 1 has such CSP structure including multilevel wiring layers as described above, and materials of the respective layers and functions thereof will be further described hereinbelow.

The I/O pads 3 corresponding to input/output terminals of the integrated circuit (not shown) formed on the semiconductor substrate 2 are electrically connected to the external electrodes 19 via the first wiring layer path composed of the seed layer 6 and the first wiring layer 7, the second wiring layer path composed of the seed layer 11 and the second wiring layer 12, the bump electrodes 14, and the bump electrode surface treating layer 18.

Among the foregoing electrical connection paths, the main wiring structural portions such as the first wiring layer 7, the second wiring layer 12, and the bump electrodes 14 are made of copper taking electrical resistance etc. into consideration. Each of the seed layers 6 and 11 for the first wiring layer 7 and the second wiring layer 12 may be formed by a plurality of layers.

Particularly, in case of the seed layer 6 for the first wiring layer 7 being the lowermost layer, since it directly contacts with the I/O pad 3 made of an aluminum alloy material, such a material that prevents counter diffusion of metal is used. In this case, there are various combinations of metal materials and, for example, the seed layer 6 may be formed by a plurality of layers of chrome-copper, titanium-copper, nickel, etc. or a single layer of one of them.

The surface protective film layer 4 being a protective film layer for the surface of the integrated circuit is formed by a silicon oxide film, a silicon nitride film, or the like.

The first insulating layer 5 is an insulating film formed under the first wiring layer 7. As described later, the first insulating layer prevents a stress from being directly exerted on the surface protective film 4 that is relatively poor in terms of strength. Such a stress is generated near each bump electrode 14 when the semiconductor device 1 is mounted on the external circuit board such as a printed wiring board by fixing the external electrodes 19 to the external circuit board through solder reflow or the like.

The second insulating layer 10 is an insulating film formed under the second wiring layer 12 and serves to maintain electrical insulation between the first wiring layer and the second wiring layer. The uppermost insulating layer 16 (a third insulating layer 16) is an insulating layer that is formed to coat the second wiring layer 12 as upper most wiring layer and the second insulating layer 10, and to level the later-described concave portions formed around the bump electrodes 14, and does not contain a filler material being relatively rough particles.

Polyimide is a typical material of the foregoing first, second, and third insulating layers 5, 10 and 16. However, taking into consideration a mechanical property, an electrical property, easiness of processing, and so on, other materials may also be selected.

Each bump electrode 14 has, in addition to the function of maintaining the electrical connection from the I/O pad 3 to the external electrode 19, another function of absorbing a thermal stress owing to its plasticity. Such a thermal stress is generated due to a difference in thermal expansion coefficient between the semiconductor device 1 and the external circuit board when the semiconductor device 1 is fixed and mounted to the external circuit board. Therefore, this capability of absorbing the thermal stress increases as the height (the distance between the top surface and the bottom surface) of the bump electrode 14 increases.

The sealing resin layer 17 has a function of protecting the wiring structure formed on the semiconductor substrate 2 and the integrated circuit, the first wiring layer 7, and the second wiring layer 12, and a function of supporting the bump electrodes 14 for improving the reliability of connection relating to the foregoing thermal stress. In the semiconductor device 1 of the first embodiment, epoxy resin including a filler material is employed as a material of the sealing resin layer 17.

Each external electrode 19 is a portion that is directly adhered to the external circuit board such as the printed wiring board upon electrically connecting and fixing the semiconductor device 1 to the external circuit board. As an electrode material thereof, a solder material enabling solder reflow is used, which frequently contains tin irrespective of being free of lead or not.

Each bump electrode surface treating layer 18 is a barrier layer that is inserted for improving solder reflow resistance when direct joining between the external electrode 19 made of such as tin and the bump electrode 14 made of mainly copper tends to cause metal counter diffusion, and further, this metal diffusion portion has a property of becoming weak, and is made of a material such as nickel. Therefore, the bump electrode surface treating layer 18 is not required depending on the degree of required reliability.

Now, the connection structures of the bump electrodes 14, the second wiring layer 12, and the first wiring layer 7 will be described in detail.

As described before, each bump electrode 14 is formed on the bottom portion of the depressed portion 20. Therefore, the opening shape of the via hole 15 that defines an area of the bottom portion of the depressed portion 20 is formed as a shape that can receive the shape of the cross section of the bump electrode 14. Accordingly, the concave portion is formed around each bump electrode 14 between the outer periphery of the bump electrode 14 and an inclined portion of the second wiring layer 12.

The uppermost insulating layer 16 not containing the filler material is formed so as to fill in this concave portion entirely to level it, and simultaneously, to cover entirely the surfaces of the second wiring layer 12 being the uppermost wiring layer, and the second insulating layer 10.

In the first embodiment, the two-layer wiring structure is explained as an example. However, even in case of a multiple wiring layer structure having greater than the two wiring layer, it is possible to ensure the height of the bump electrode by forming via holes of insulating films between the respective layers so as to be overlapped with each other, and forming each depressed portion of the uppermost wiring layer, where the bump electrode is formed, so as to reach the wiring of a lower layer.

This reaching to the lower wiring layer is performed for ensuring the height of the bump electrode 14, so that it is sufficient to obtain a height necessary for absorbing a thermal stress to such an extent that can ensure the reliability, and thus it is not necessary to perform reaching to the wiring of a further lower layer.

As described above, according to the semiconductor device 1 having the CSP structure of the first embodiment, the height (the distance between the top surface of the bump electrode and the bottom surface of the bump electrode) of each bump electrode 14 formed on the second wiring layer 12 being the uppermost wiring layer can be increased by the thickness of the second insulating layer 10 without changing the thickness of the whole semiconductor device 1, so that it becomes possible to enhance the suppressing effect by the bump electrode 14 relative to the thermal stress correspondingly.

Further, the third insulating layer 16 (the upper most insulating layer) covers the second wiring layer 12 and the second insulating layer 10 having different adhesion tendencies relative to the sealing resin layer 17, and the concave portions formed around the bump electrodes 14 in the leveled state. With this structure, the filler material having a relatively large particle size and included in the sealing resin layer 17 does not enter into the concave portions. As a result, this structure can be kept uniform in the adhesion states at various portions without forming voids, so that it becomes possible to improve moisture resistance of the semiconductor device.

Second Embodiment

Figure 2:
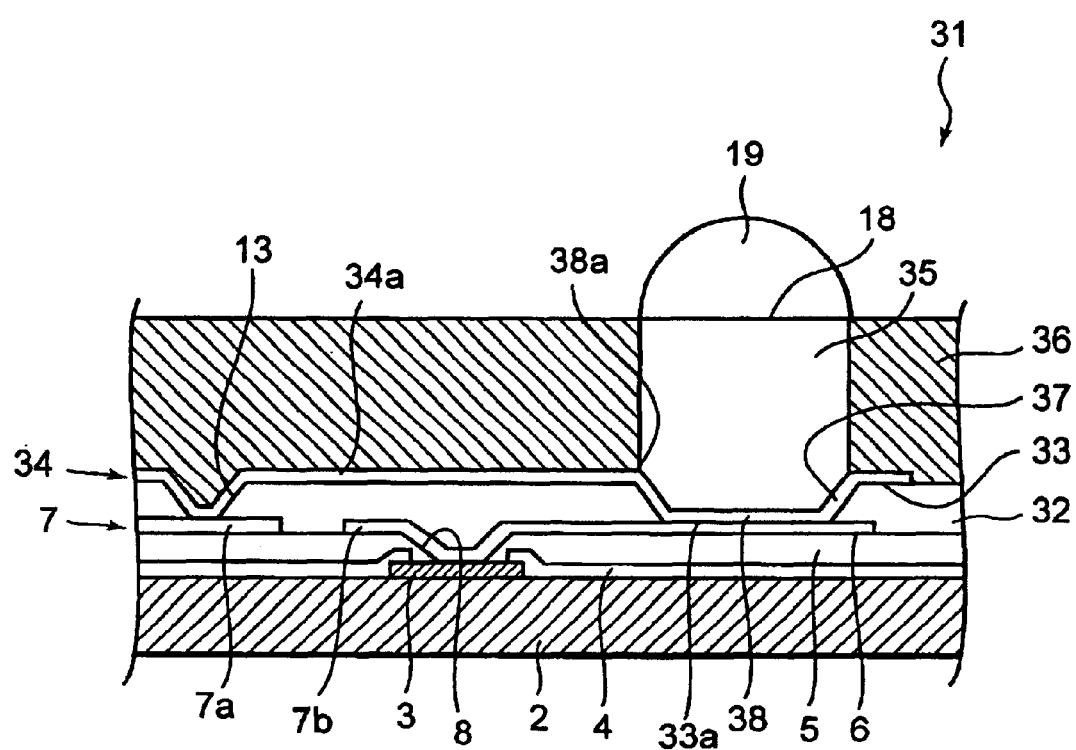
FIG. 2 is a partial sectional view showing an internal structure of a CSP structure of a second embodiment according to a semiconductor device of the present invention.

FIG. 2 is a partial sectional view showing an internal structure of a CSP structure of a second embodiment according to a semiconductor device of the present invention.

A semiconductor device 31 having the CSP structure of the second embodiment mainly differs from the semiconductor device 1 of the foregoing first embodiment shown in FIG. 1 in a shape of part of each bump electrode 35 (FIG. 2) and part of a seed layer 33. Therefore, those portions of the semiconductor device 31 of the second embodiment that are the same as or correspond to those of the semiconductor device 1 of the first embodiment are assigned the same reference symbols, or figures thereof are omitted, thereby to omit explanation thereof, and different points will be described preponderantly.

A second insulating layer 32 is an insulating layer for a second wiring layer path formed thereon, and is formed to cover first wiring layer 7 except via holes 13 and 37 that expose later-described predetermined portions of the first wiring layer 7. These via holes are formed in a developing process by the photolithography, and peripheral portions thereof are formed tapered, respectively.

The seed layer 33 is a layer that serves as an electrode for forming second wiring layer 34 by plating on the second insulating layer 32 and the first wiring layer 7 exposed by the via holes, and is removed after the formation of the wiring, except those portions under wiring patterns. On the other hand, the seed layer 33 of the semiconductor device 31 of the second embodiment has an opening 33a at a bottom portion of each via hole 37. That is, the seed layer 33 does not exist an interface between the first wiring layer 7 and the second wiring layer 34. In an area of the opening 33a, the first wiring layer 7 acts as an electrode upon plating.

Predetermined wiring patterns, among wiring patterns 34a, 34b, . . . (only the wiring pattern 34a is shown in FIG. 2) of the second wiring layer 34 formed by plating as described above, have depressed portions 38 at the via holes 13 and 37. The second wiring layer 34 is directly plated on the predetermined wiring patterns of the first wiring layer 7 in areas of the openings 33a of the seed layer 33 and thus electrically connected thereto directly, i.e. not via the seed layer 33.

The partial sectional view of FIG. 2 only shows connecting portions between the second wiring pattern 34a and the first wiring patterns 7a and 7b.

Bump electrodes 35 are formed at predetermined portions on the respective wiring patterns 34a, 34b, . . . of the second wiring layer 34 being the uppermost wiring layer so as to electrically connect to the corresponding patterns. The bump electrodes 35 at the depressed portion 38a are formed by, for example, plating using the first wiring layer 7 as an electrode. When forming the bump electrodes 35 in the depressed portions 38 of the second wiring layer 34, each of them is processed so as to be formed over an area covering the whole depressed portion 38. Therefore, the bump electrode 35 is formed such that the shape of its cross section covers at least an area of inclination surface (tapered portion).

A sealing resin layer 36 is directly formed on the second wiring layer 34 and the second insulating layer 32 so as to cover them. The sealing resin layer 36 has a thickness to such an extent that the top surface of each bump electrode 35 is exposed. An external electrode 19 is provided on a bump electrode surface treating layer 18 formed on the top surface of the bump electrode 35 that is exposed from the surface of the sealing resin layer 36.

By forming the wiring into multiple layers as described above the degree of freedom for wiring design can be enhanced as compared with single wiring layer. FIG. 2 shows the structure wherein the second wiring pattern 34a is connected to the first wiring patterns 7a and 7b, and the first wiring pattern 7b is connected to the I/O pad 3. However, connecting portions therebetween are suitably provided according to wiring design.

The semiconductor device 31 has the CSP structure including multilevel wiring layers as described above. Among them, materials and functions of the second insulating layer 32, the seed layer 33, the second wiring layer 34, the bump electrodes 35, and the sealing resin layer 36 have many points common to those of the second insulating layer 10, the seed layer 11, the second wiring layer 12, the bump electrodes 14, and the sealing resin layer 17. Explanation about these common portions is omitted, while structures and functions of different portions will be further described preponderantly hereinbelow.

As described above, the seed layer 33 is formed with the openings 33a at the bottom portions of the depressed portions 38 of the second wiring layer 34, and the second wiring layer 34 is directly connected to the first wiring layer 7 in the areas of the openings 33a.

Each bump electrode 35 is formed by plating so as to cover the depressed portion 38. Thereupon, for example, a recess is formed such that a bump space having the depressed portion 38 as a bottom portion thereof is formed, and plating is implemented to form the bump electrode 35 in the bump space, so that, as shown in FIG. 2, the bump electrode 35 is formed such that the shape of its cross section covers the area of the depressed portion 38.

Accordingly, the concave portion is not formed around each bump electrode 35 between the outer periphery of the bump electrode 35 and the inclined portion of the second wiring layer 34, as opposed to the case of the bump electrode 14 of the semiconductor device 1 of the first embodiment shown in FIG. 1.

Thus, for forming the bump electrode 35 having a desired cross-section shape, each via hole 37 is formed such that the circumference shape of a lower end portion 38a of the depressed portion 38 of the second wiring layer 34 substantially agrees with the cross-section shape of the bump electrode 35.

The sealing resin layer 17 directly covers the second wiring layer 34 and the second insulating layer 32 without providing the uppermost insulating layer 16 like in the case of the semiconductor device 1 of the first embodiment shown in FIG. 1, and further, is formed to have a thickness to such an extent that the top surface of each bump electrode 35 is exposed.

In the second embodiment, the two-layer wiring structure is explained as an example. However, even in case of a multiple wiring layer structure having greater than the two-wiring layer, it is possible to ensure the height of the bump electrode by forming via holes of insulating films between the respective layers so as to be overlapped with each other, and forming each depressed portion of the uppermost wiring layer, where the bump electrode is formed, so as to reach the wiring of a lower layer.

This reaching to the lower wiring layer is performed for ensuring the height of the bump electrode 35, so that it is sufficient to obtain a height necessary for absorbing a thermal stress to such an extent that can ensure the reliability, and thus it is not necessary to perform reaching to the wiring of a further lower layer.

Further, in the second embodiment, since the concave portions causing generation of voids are not formed around the bump electrodes 35 at the depressed portions 38, the sealing resin layer 36 is formed without forming the uppermost insulating layer 16 shown in the first embodiment. However, an insulating layer like the uppermost insulating layer 16 shown in the first embodiment may be provided for uniforming respective adhesion states between the second wiring layer 34 and the second insulating layer 32 having different adhesion tendencies.

As described above, according to the semiconductor device 31 having the CSP structure of the second embodiment, like in the first embodiment, the height (the distance between the top surface of the bump electrode and the bottom surface of the bump electrode) of each bump electrode 35 can be increased by the thickness of the second insulating layer 32 without changing the thickness of the whole semiconductor device 31, so that it becomes possible to enhance the suppressing effect by the bump electrode 35 relative to the thermal stress correspondingly.

Further, since the concave portions are not generated around the bump electrodes 35 as opposed to the first embodiment, the layer (the uppermost insulating layer 16 in the first embodiment) for filling in the concave portions to level them is not required so that the structure is simplified and it becomes advantageous in manufacturing cost.

Furthermore, since the second wiring layer 34 and the first wiring layer 7 are electrically connected to each other without need for the seed layer 33 made of titanium, nickel or the like whose resistivity is relatively high, the wiring resistance can be suppressed to a low level.

Third Embodiment

A semiconductor device of a third embodiment is configured such that, for example, the seed layer 11 for the second wiring layer 12 is made of copper that is the same as the main material of the wiring.

The seed layer 6 for the first wiring layer 7 directly contacts with the I/O pads 3, normally made of an aluminum alloy, of the integrated circuit (not shown). Therefore, the seed layer 6 is designed to have a stacked wiring layer structure wherein a layer made of a material such as chrome, titanium or nickel that can prevent counter diffusion of metal, is provided under a copper layer, thereby to ensure a barrier and adhesion between aluminum and copper.

On the other hand, since the seed layer 11 for the second wiring layer 12 is formed on the first insulating layer 5 made of, for example, polyimide, there is no possibility of occurrence of metal counter diffusion so that the seed layer 11 can be formed by single layer of copper only. Therefore, even in case of a multiple wiring layer structure greater than the foregoing two wiring layer structure, all the seed layers except a seed layer for the lowermost wiring layer can be each formed by a single layer structure made of, for example, copper that is the same as the main material of the wiring.

According to the foregoing semiconductor device of the third embodiment, since the seed layer(s) of the second or higher level layer is formed only by a layer of copper that is the same as the main material of the wiring, the wiring resistance can be suppressed to a low level.

Fourth Embodiment

Figure 3A:
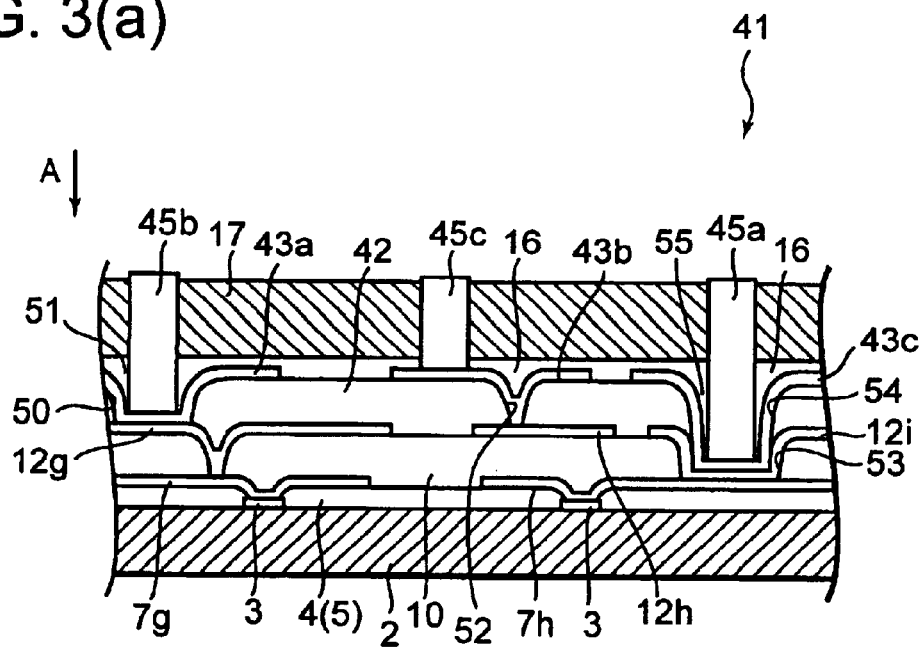
Figure 3B:
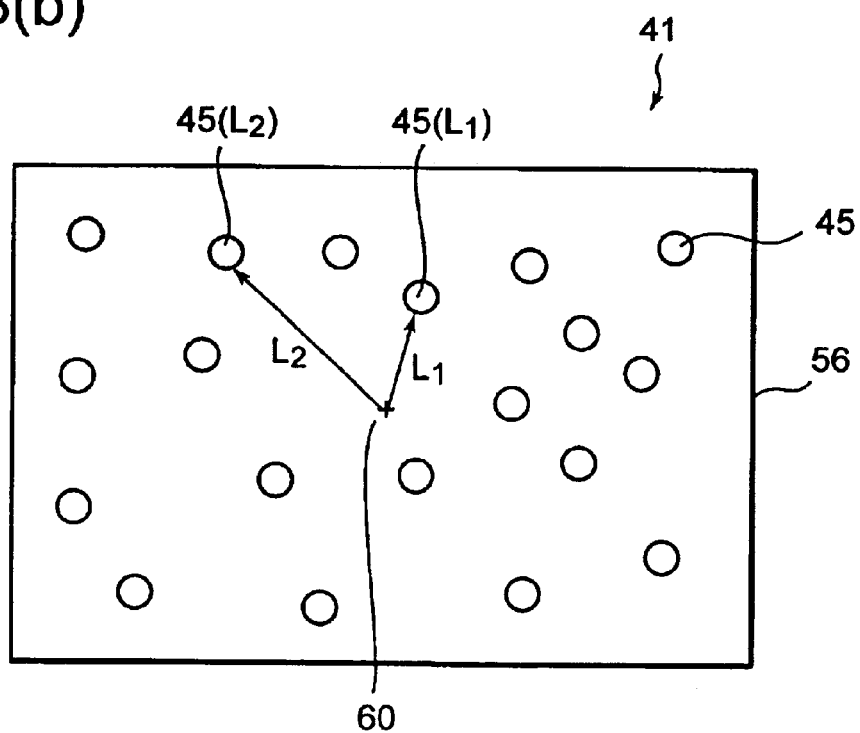

FIGS. 3A and 3B are diagrams showing a structure of a fourth embodiment according to a semiconductor device of the present invention, wherein FIG. 3A is a partial sectional view exemplarily showing an internal structure of a CSP structure, and FIG. 3B is a schematic plan view, as seeing the semiconductor device in a direction of arrow A in FIG. 3A.

A semiconductor device 41 of the present invention mainly differs from the semiconductor device 1 of the foregoing first embodiment in that a wiring layer has a three-layer structure, and bump electrodes are formed so as to satisfy predetermined conditions as described later. Therefore, those members of the semiconductor device 41 of the fourth embodiment that are common to those of the semiconductor device 1 of the first embodiment shown in FIG. 1 are assigned the same reference symbols, thereby to omit explanation thereof, and different points will be described preponderantly.

In FIG. 3A, a depressed portion 51 of a third wiring pattern 43a formed at a via hole 50 of a third insulating layer 42 is connected to a second wiring pattern 12g via a seed layer (not shown), while the second wiring pattern 12g is connected to an I/O pad 3 of an integrated circuit via a seed layer 11 not shown (see FIG. 1), a first wiring pattern 7g, and a seed layer 6 not shown (see FIG. 1). A bump electrode 45b, having a height to such an extent that its top surface is exposed from a sealing resin layer 17, formed on a bottom portion of the depressed portion 51.

A depressed portion of a third wiring pattern 43b formed at a via hole 52 of the third insulating layer 42 is connected to a second wiring pattern 12h via the seed layer (not shown), wherein the depressed portion is formed as a connecting portion between the third wiring pattern 43b and the second wiring pattern 12h. A bump electrode 45c, having a height to such an extent that its top surface, is exposed form the sealing resin layer 17.

A depressed portion of a second wiring pattern 12i formed at a via hole 53 of a second insulating layer 10 is connected to an I/O pad 3 of the integrated circuit via the seed layer 11 not shown (see FIG. 1) and a first wiring pattern 7h. A via hole 54 of the third insulating layer 42 is formed in a position where it overlaps with the via hole 53 of the second insulating layer 10, and a depressed portion 55 of a third wiring pattern 43c is connected to the depressed portion of the second wiring pattern 12i in an overlapped manner. A bump electrode 45a, having a height to such an extent that its top surface is exposed from the sealing resin layer 17, is formed on a bottom portion of the depressed portion 55.

Accordingly, as shown in FIG. 3A, the height (the distance between the top surface and the bottom surface) of the bump electrode 45b formed to be lower than the bump electrode 45a by substantially a thickness of the second insulating layer 10, and further, the height (the distance between the top surface and the bottom surface) of the bump electrode 45c is formed to be lower than the bump electrode 45b by substantially a thickness of the third insulating layer 42.

On the other hand, FIG. 3B is a plan view schematically showing the state where many bump electrodes 45 thus formed and having different heights are distributed on a mounting surface 56 of the semiconductor device 41.

In FIG. 3B, assuming that distances from the surface center 60 identified by + to a pair of bump electrodes $45(L_1)$ and $45(L_2)$ having different distances from the surface center 60 are set as $L_1$ and $L_2$, and heights of the bump electrodes $45(L_1)$ and $45(L_2)$ are set as $H_1$ and $H_2$, respectively, the bump electrodes are arranged so as to satisfy:

when $L_1 < L_2$, then $H_1 \leq H_2$.

Specifically, the bump electrode 45 located more radially outward from the center of the semiconductor device 41 is given a greater height.

Figure 4:
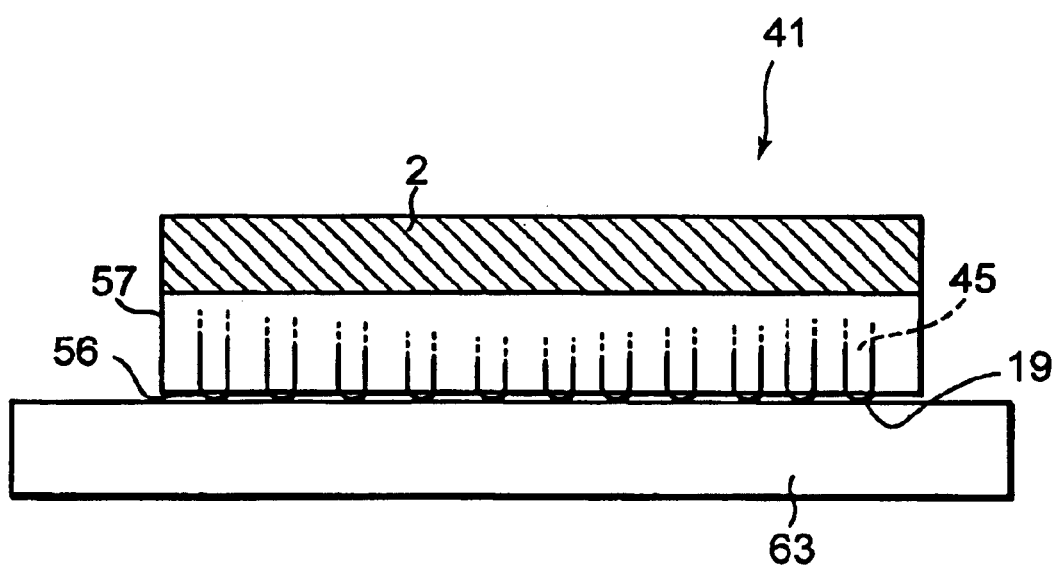
FIG. 4 is an explanatory diagram for explaining a characteristic of the semiconductor device of the fourth embodiment according to the present invention.

FIG. 4 is an explanatory diagram for explaining a characteristic of the semiconductor device 41 of the fourth embodiment.

As shown in FIG. 4, the semiconductor device 41 thus formed is placed on an external circuit board 63 in an orientation that the mounting surface 56 from which the external electrodes 19 formed at the top surface of the bump electrodes 45 protrude, confronts the external circuit board 63, and is mounted thereon by fixing the individual bump electrodes 45 to the external circuit board 63 through solder reflow or the like. In FIG. 4, numeral 2 represents the semiconductor substrate, and numeral 57 represents the wiring layer of the CSP structure in which the layered wiring is formed and the bump electrodes 45 having different heights are provided.

As described above, the semiconductor device 41 is configured such that the higher (longer) bump electrodes 45 are arranged at outer peripheral portions of the mounting surface 56 that are subjected to greater influence of thermal stresses as compared with the center portion thereof when the semiconductor device 41 is connected and fixed to the external circuit board 63 as shown in FIG. 4.

With the foregoing structure, when a thermal stress is generated due to a difference in thermal expansion coefficient between the semiconductor device 41 and the external circuit board 63 when mounting the semiconductor device 41 on the external circuit board 63, the bump electrodes 45 having higher suppressing effects against the thermal stress assume charge thereof at the outer peripheral portions of the mounting surface 56 that receive greater influence of the thermal stress as compared with the center portion thereof.

According to the semiconductor device 41 having the CSP structure of the fourth embodiment thus structured, since the influence of the thermal stress is not concentrated to the outer peripheral portions, but dispersed over the whole, it is possible to avoid such a situation where failures caused by the thermal stress are concentrated to the outer peripheral portions, like connecting portions between the external circuit board 63 and the external electrodes 19 arranged at the outer peripheral portions precedingly cause breakage due to thermal fatigue. As a result, the reliability of the whole apparatus can be improved.

In the appended claims and the foregoing description of the embodiments, the terms as "upper" and "lower" are used. However, these terms are used for convenience sake and do not limit an absolute positional relationship in the state of arrangement of a semiconductor device.

According to the semiconductor device of the present invention, since the height of the bump electrode formed on the uppermost layer wiring can be increased without changing a thickness of the whole semiconductor device, the suppressing effect by the bump electrode against the thermal stress can be enhanced.

Further, since the bump electrodes having different heights can be formed, it is possible to avoid such a situation where failures caused by the thermal stress are concentrated to the outer peripheral portions, by taking into consideration the arrangement of the bump electrodes on the mounting surface. As a result, the reliability of the whole apparatus can be improved.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device having a semiconductor substrate formed with a plurality of electrode pads, and wiring electrically connecting said electrode pads to external electrodes to be connected to conductive patterns formed on an external circuit board, said wiring formed as a plurality of layers, said semiconductor device comprising:

insulating layers interposed between the layers of said wiring, and between a lowermost layer of said wiring and said semiconductor substrate, thereby to ensure insulation therebetween;

each of said layers of said wiring having depressed portions located at via holes formed in said insulating layers, said depressed portions being connected to the lowermost layer of said wiring or said electrode pads, and having flat portions located on said insulating layers and serving as lateral conductors to other electrical connections on said insulating layers;

bump electrodes formed on said depressed portions of an uppermost layer of said wiring;

external electrodes formed on the top surfaces of said bump electrodes; and a sealing layer formed over said uppermost layer of said wiring so as to expose the top surface of said bump electrodes.

2. A semiconductor device according to claim 1, wherein said depressed portions of said layers of said wiring including said uppermost layer are formed in positions where said depressed portions overlap with each other.

3. A semiconductor device according to claim 1, wherein each of said bump electrodes is formed so as to rise from a bottom portion of the corresponding depressed portion.

4. A semiconductor device according to claim 1, wherein each of said bump electrodes is formed so as to cover the corresponding depressed portion.

5. A semiconductor device according to claim 1, wherein an uppermost insulating layer is further formed between said sealing layer and said uppermost layer of said wiring, said uppermost insulating layer having a substantially flat surface and does not include a filler material.

6. A semiconductor device according to claim 1, further comprising seed layers each formed under the corresponding layer of said wiring and acting as an electrode for forming the corresponding layer of said wiring.

7. A semiconductor device according to claim 6, wherein said seed layer has an opening at each of said depressed portions of said wiring.

8. A semiconductor device according to claim 6, wherein said seed layers, except a seed layer formed under said lowermost layer of said wiring, are made of a material that is the same as that of said wiring.

9. A semiconductor device according to claim 1, wherein each of said external electrodes is made of a solder material including tin, and each of said bump electrodes is made of copper; further comprising a barrier layer including nickel formed between each of said external electrodes and the corresponding bump electrode.

10. A semiconductor device according to claim 1, wherein, assuming that distances from a neutral point of a thermal stress of the semiconductor device to an arbitrary pair of bump electrodes among said bump electrodes are set as L1 and L2, and heights of said pair of bump electrodes are set as H1 and H2, the heights of said pair of bump electrodes are determined so as to satisfy:

when L1<L2, then H1≦H2.

11. A semiconductor device, comprising:

a semiconductor substrate which has a main surface;

an electrode pad which is formed on the main surface;

an insulating layer;

a plurality of redistribution wirings which are formed over the main surface and which are formed at different levels, wherein the redistribution wiring at a lowermost level is connected to the electrode pad, wherein the redistribution wiring at an uppermost level is disposed on the insulating layer and has a depressed portion to which the redistribution wiring at the lowermost level is connected, and flat portions located on said insulating layers and serving as lateral conductors to other electrical connections on said insulating layers;

a bump electrode which is formed on the depressed portion of the redistribution wiring at the uppermost level;

an external electrode which is formed on a top surface of the bump electrode; and a sealing layer which is formed over the redistribution wiring at the uppermost level so as to expose the top surface of the bump electrode.

12. A semiconductor device according to claim 11, wherein the redistribution wiring at the lowermost level has a depressed portion and wherein the depressed portion of the redistribution wiring at the uppermost level and the depressed portion of the redistribution wiring at the lowermost level are positioned to overlap each other.

13. A semiconductor device according to claim 11, wherein the bump electrode is formed so as to rise from a bottom portion of the depressed portion.

14. A semiconductor device according to claim 11, wherein the bump electrode is formed so as to entirely cover the depressed portion.

15. A semiconductor device according to claim 11, further comprising a further insulating layer which is formed between the sealing layer and the redistribution wiring at the uppermost level and which has a substantially flat surface and does not include a filler material.

16. A semiconductor device, comprising:

a semiconductor substrate which has a main surface;

a plurality of electrode pads which are formed on the main surface;

a plurality of redistribution wirings which are formed over the main surface and which are formed at different levels, wherein the redistribution wirings at a lowermost level are connected to corresponding electrode pads and the redistribution wirings at an uppermost level are coupled to corresponding redistribution wirings at the lowermost levels through redistribution wirings at a middle level;

a plurality of bump electrodes which are formed on corresponding portions of the redistribution wirings at the uppermost level;

a plurality of external electrodes which are formed on a top surface of corresponding bump electrodes; and a sealing layer which is formed over the redistribution wirings at the uppermost levels so as to expose the top surface of the bump electrodes, wherein assuming that distances from a neutral point of a thermal stress of the semiconductor device to an arbitrary pair of bump electrodes among the bump electrodes are set as L1 and L2 and a length of the pair of bump electrodes are set as H1 and H2, the length of the pair of bump electrodes are determined so as to satisfy:

when L1<L2, then H1≦H2.

17. A semiconductor device, comprising:

a semiconductor substrate which has a main surface;

an electrode pad which is formed on the main surface;

a plurality of insulating layers which are formed over the main surface, and which are formed at different levels and which have via holes;

a plurality of redistribution wirings which are formed at different levels, the redistribution wiring at each level being formed on a surface and the via hole of a corresponding insulating layer, wherein the redistribution wiring at a lowermost level is connected to the electrode pad, wherein the redistribution wiring at an uppermost level has a depressed portion located at the via hole defined by the insulating layer at the uppermost level and is connected to the redistribution wiring of the lowermost level at the via hole, and has flat portions located on said insulating layers and serving as lateral conductors to other electrical connections on said insulating layers;

a bump electrode which is formed on the depressed portion of the redistribution wiring at the uppermost level;

an external electrode which is formed on a top surface of the bump electrode; and a sealing layer which is formed over the redistribution wiring at the uppermost level so as to expose the top surface of the bump electrode.

18. A semiconductor device according to claim 17, wherein the redistribution wiring at the lowermost level has a depressed portion located at the via hole of the insulating layer at the lowermost level and wherein the via hole of the insulating layer at the uppermost level and the via hole of the insulating layer at the lowermost level are positioned to overlap each other.

19. A semiconductor device according to claim 17, wherein the bump electrode is formed so as to rise from a bottom of the via hole.

20. A semiconductor device according to claim 17, wherein the bump electrode is formed so as to entirely covert the via hole.

* * * * *